(12) United States Patent
Shi et al.

(10) Patent No.: US 7,971,120 B2
(45) Date of Patent: Jun. 28, 2011

(54) METHOD AND APPARATUS FOR COVERING A MULTILAYER PROCESS SPACE DURING AT-SPEED TESTING

(75) Inventors: Yiyu Shi, Los Angeles, CA (US);
Chandramouli Visweswariah, Croton-on-Hudson, NY (US); Jinjun Xiong, White Plains, NY (US);
Vladimir Zolotov, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 180 days.

(21) Appl. No.: 12/340,072

(22) Filed: Dec. 19, 2008

(65) Prior Publication Data

US 2010/0162064 A1    Jun. 24, 2010

(51) Int. Cl.
*G06F 11/00* (2006.01)
(52) U.S. Cl. .......................................... 714/741; 703/14
(58) Field of Classification Search .................. 327/149; 716/16, 6; 700/103; 714/39, 738, 741; 703/19, 703/14; 709/226
See application file for complete search history.

(56) References Cited

U.S. PATENT DOCUMENTS

| | | | |
|---|---|---|---|
| 7,116,142 B2 * | 10/2006 | Ferraiolo et al. | 327/149 |
| 7,257,800 B1 * | 8/2007 | Singh et al. | 716/16 |
| 7,478,356 B1 * | 1/2009 | Sundararajan et al. | 716/16 |
| 7,620,921 B2 | 11/2009 | Foreman et al. | |
| 7,647,573 B2 | 1/2010 | Abadir et al. | |
| 7,886,247 B2 * | 2/2011 | Fatemi et al. | 703/19 |
| 2003/0188246 A1 | 10/2003 | Rearick et al. | |
| 2005/0065765 A1 | 3/2005 | Visweswariah | |
| 2007/0288822 A1 | 12/2007 | Lin et al. | |
| 2008/0183731 A1 | 7/2008 | Gilbert | |
| 2008/0209292 A1 | 8/2008 | Yokota et al. | |
| 2008/0270953 A1 | 10/2008 | Foreman et al. | |
| 2009/0037854 A1 | 2/2009 | Bittlestone et al. | |
| 2009/0100393 A1 * | 4/2009 | Visweswariah et al. | 716/6 |
| 2009/0112344 A1 * | 4/2009 | Nackaerts et al. | 700/103 |
| 2009/0115469 A1 | 5/2009 | Cortadella et al. | |
| 2009/0119629 A1 | 5/2009 | Grise et al. | |

OTHER PUBLICATIONS

Jess et al.; "Statistical Timing for Parametric Yield Prediction of Digital Integrated Circuits"; IEEE; vol. 25, No. 11; Nov. 2006; pp. 2376-2392.
"Variation-Aware Performance Verification Using At-Speed Structural Test and Statistical Timing", by Vikram Iyengar, Jinjun Xiong, Subbayyan Venkatesan, and Vladimir Zolotov, pp. 405-412, @2007 by IEEE.

* cited by examiner

*Primary Examiner* — David Ton

(57) ABSTRACT

In one embodiment, the invention is a method and apparatus covering a multilayer process space during at-speed testing. One embodiment of a method for selecting a set of paths with which to test a process space includes determining a number N of paths to be included in the set of paths such that at least number M of paths in N for which testing of the process space will fail, computing a metric that substantially ensures that the set of paths satisfies the requirements of N and M, and outputting the metric for use in selecting the set of paths.

25 Claims, 5 Drawing Sheets

METHOD AND APPARATUS FOR COVERING A MULTILAYER PROCESS SPACE DURING AT-SPEED TESTING

BACKGROUND OF THE INVENTION

The present invention relates generally to design automation, and relates more particularly to statistical timing of integrated circuit (IC) chips.

When IC chips come off the manufacturing line, the chips are tested "at-speed" to ensure that they perform correctly (and to filter out chips that do not perform correctly). In particular, a set of paths is selected, and the set of paths is then tested for each chip in order to identify the chips in which one or more of the selected paths fail timing requirements. Selection of these paths is complicated by the presence of process variations. Because of these variations, different paths can be critical in different chips. That is, a path that is critical in one chip may not be critical in another chip, and vice versa. As such, selection of the paths that have a higher probability of being critical is typically a goal.

Conventional test pattern generation tools select these paths based on a single-layer process space coverage metric. As such, some points (i.e., combinations of process parameters) in the process space may only be covered by one path. If that path is not sensitizable (i.e., not capable of being tested), then these points in the process space may be left uncovered by the at-speed testing, resulting in a loss of test quality.

Thus, there is a need in the art for a method and apparatus for covering a multilayer process space during at-speed testing.

SUMMARY OF THE INVENTION

In one embodiment, the invention is a method and apparatus covering a multilayer process space during at-speed testing. One embodiment of a method for selecting a set of paths with which to test a process space includes determining a number N of paths to be included in the set of paths such that at least number M of paths in N for which testing of the process space will fail, computing a metric that substantially ensures that the set of paths satisfies the requirements of N and M, and outputting the metric for use in selecting the set of paths.

BRIEF DESCRIPTION OF THE DRAWINGS

So that the manner in which the above recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In one embodiment, the present invention is a method and apparatus for covering a process space multiple times during at-speed testing of IC chips. Embodiments of the invention select paths for at-speed testing such that each point in the process space is covered at least "M" times, where M is a user definable parameter. In other words, at least M test paths cover each point. As such, even if some paths are not sensitizable, the process space may still be covered by other paths. The redundancy achieved by controlling or customizing the coverage of the process space in this way improves the robustness of the at-speed testing process.

In statistical timing, all timing quantities such as slack S are represented as functions (e.g., linear or quadratic) of the underlying process parameters $\Delta X$ (i.e., $S=F(\Delta X)$, where $\Delta X$ is a k×1 vector containing normalized Gaussian random variables to model the variation of the process parameters, including chip-to-chip, within chip, and local random variations). The entire k-dimensional space spanned by $\Delta X$ is also called the "process space" and is denoted by $\Omega = \{\Delta X | \Delta X \in R^k\}$.

The meaning of process space coverage and its metric C can be explained by defining a mapping from the path slack $S_i$ to a subspace $\omega_i \subseteq \Omega$ as:

$$\omega_i = \{\Delta X | S_i = F_i(\Delta X) \leq 0\} \quad \text{(EQN. 1)}$$

For a set of N paths, the corresponding single-layer subspace $\omega_N^{(1)} \subseteq \Omega$ is the union of the subspaces defined by each individual path, i.e.:

$$\omega_N^{(1)} = \omega_1 \cup \ldots \cup \omega_N \quad \text{(EQN. 2)}$$

In other words, a set of paths defines (or covers) a subspace of the entire process space such that by testing the set of paths at-speed, all bad chips manufactured under those process conditions can be sorted out. The corresponding process coverage metric C can thus be interpreted as:

$$q(\Pi) = \frac{|\omega_N^{(1)}|}{|\Omega|} \quad \text{(EQN. 3)}$$

where $|\cdot|$ is a Lebesgue measure (i.e., probability-weighted area) of the process space.

Figure 1:
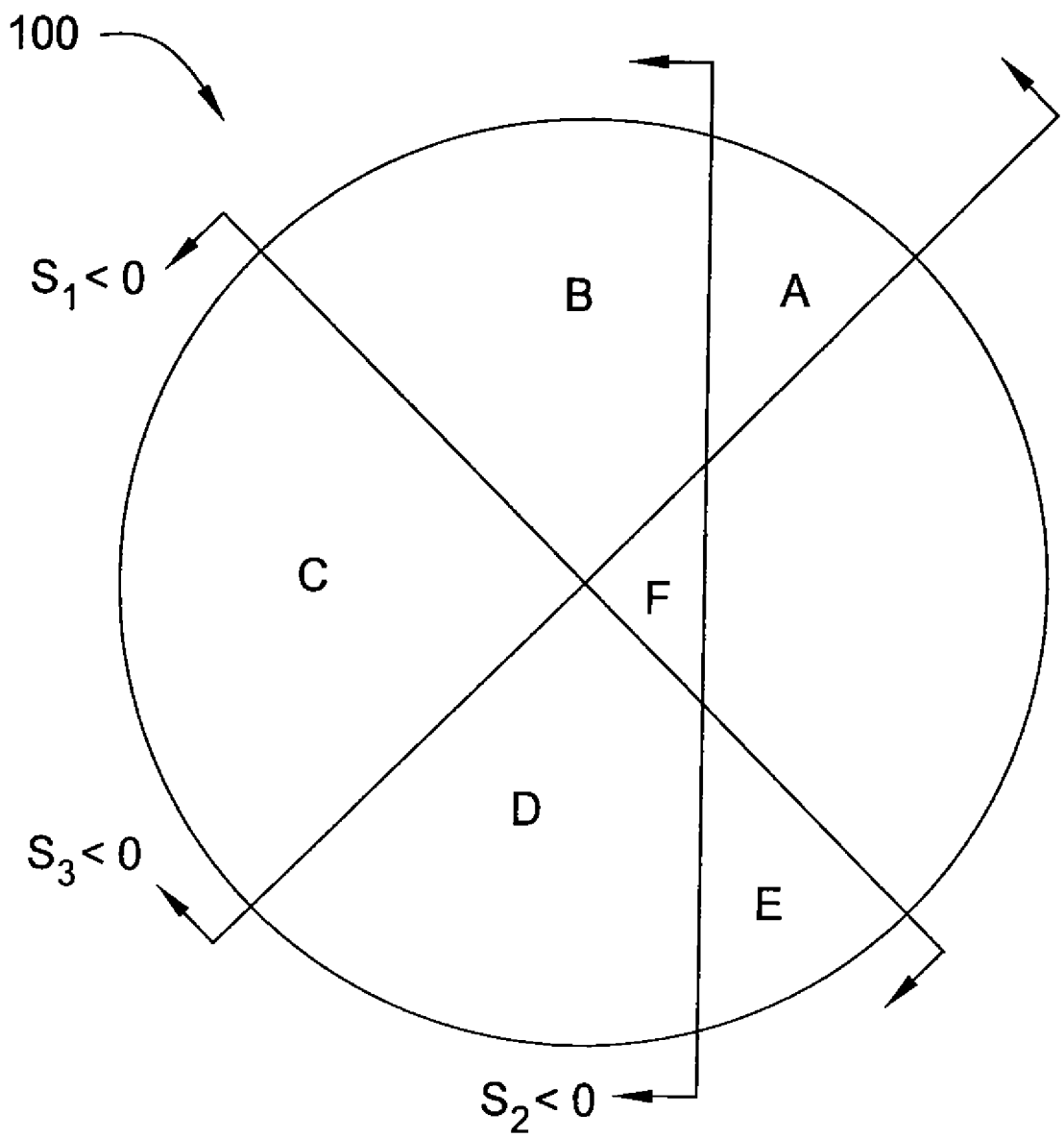
FIG. 1 is a schematic diagram illustrating the concepts of the present invention.

FIG. 1 is a schematic diagram illustrating the concepts of the present invention. Specifically, FIG. 1 illustrates an exemplary two-dimensional process space 100. At any given point in the process space 100, among the N paths being tested, there will be at least M paths that fail testing. This indicates M-layer coverage at that point. For example, supposed that M=2 and N=3, with the space covered by path slacks denoted as $S_1$, $S_2$, and $S_3$ (where a path's path slack refers to how much faster a signal can propagate through the path than required). The process coverage by each of the path slacks $S_1$, $S_2$, and $S_3$, individually, is single-layer. For instance, within the three-sigma circular region of the process space 100, the subspace covered by path slack $S_1$ is CUDUE, the subspace covered by path slack $S_2$ is BUCUDUF, and the subspace covered by path slack $S_3$ is AUBUC.

On the other hand, the subspace covered by all M paths is given by:

$$\omega_M^{(M)} = \omega_1 \cup \ldots \cup \omega_M \quad \text{(EQN. 4)}$$

In other words, the subspace $\omega_M^{(M)}$ is covered M times. For a set of N paths $\Pi=\{\pi_1, \pi_2, \ldots, \pi_N\}$, with corresponding coverage subspace $\{\omega_1, \omega_2, \ldots \omega_N\}$, the subspace covered at least M times by the set of N paths, $\omega_N^{(M)} \subset \Omega$, would be the union of $\omega_{M,i}^{(M)}$ with each $\omega_{m,i}^{(M)}$ covered by all paths forming a subset of M paths from $\Pi$. There are a total of $$\binom{N}{M}$$

number of $\omega_{M,i}^{(M)}$. Mathematically, this is expressed as:

$$\omega_N^{(M)} = \bigcup_{\forall i \in \binom{N}{M}_{comb}} (\omega_{M,i}^{(M)}) \quad \text{(EQN. 5)}$$

Similar to EQN. 3, a multilayer process space coverage metric can be thus defined as:

$$q^{(M)}(\Pi) = \frac{|\omega_N^{(M)}|}{|\Omega|} \quad \text{(EQN. 6)}$$

As such, process space in FIG. 1 that has two-layer coverage (i.e., M=2 such that the process space is covered at least by two of the N path slacks $S_1$, $S_2$, and $S_3$), such as the regions denoted as B, C, and D in FIG. 1, is given by:

$$\omega_3^{(2)} = (\omega_1 \cap \omega_2) \cup (\omega_1 \cap \omega_3) \cup (\omega_2 \cap \omega_3) \quad \text{(EQN. 7)}$$

The result is B∪C∪D. Thus, in general, for M=2, one has:

$$\omega_N^{(2)} = \bigcup_{i \neq j} (\omega_i \cap \omega_j) \quad \text{(EQN. 8)}$$

More generally:

$$\omega_N^{(M)} = \bigcup_{\substack{\forall comb\, of M \\ from S_1, \ldots, S_N}} \bigcap_{i=1}^{M} \omega_i, comb. \quad \text{(EQN. 9)}$$

The number of combinations is:

$$\binom{N}{M} = \frac{N!}{M!(N-M)!} \quad \text{(EQN. 10)}$$

Embodiments of methods for efficiently determining $$\binom{N}{M}$$

(and, thus, for selecting the best set of test paths to achieve M-layer coverage) is discussed in greater detail below.

A path fails testing if and only if its path slack is less than a required path slack $S_M$ (implying that the path is too slow and causes a timing violation). Thus, a process coverage metric C for achieving M-layer coverage is substantially equal to the probability that a set of paths fails testing, or:

$$C = P(\text{path slack} \leq S_M) \quad \text{(EQN. 11)}$$

For single-layer coverage (i.e., M=1), $C=P(\min\{S_i\} \leq S_M)$, where $S_i$ indicates the $i^{th}$ path slack of the set of paths selected for testing. In other words, the process coverage metric for single-layer coverage is the weighted area covered by all paths selected for testing. For instance, referring to the process space 100, C=

$$\frac{|\omega_1 \cup \omega_2 \cup \omega_3|}{|\Omega|} = P(\min\{S_1, S_2, S_2\} \leq S_M).$$

As discussed above, embodiments of the present invention provide a multilayer process coverage metric. Referring back to EQN. 9:

$$C = P\left(\min_{\substack{\forall comb\, of M \\ from S_1, \ldots, S_N}} \left\{\max_{i=1, \ldots, M}\{S_i, comb\}\right\} \leq S_M\right) \quad \text{(EQN. 12)}$$

Where M=2, the combinations of paths are $O(N^2)$; however, for M>2, the combinations are exponentially larger (i.e., $O(N^3) \sim O(2^N)$). Brute force computation of the multilayer process coverage metric C is therefore likely to be infeasible to compute in most cases. The present invention therefore provides methods for efficiently computing the multilayer process coverage metric C, described in greater detail below with respect to FIG. 2.

In one embodiment, the present invention defines a function $f_{N,k}(S_1, \ldots, S_N) \equiv k^{th}$ smallest path slack of N path slacks $S_1, \ldots, S_N$. As special cases, $f_{N,1}(S_1, \ldots, S_N) = \min(S_1, \ldots, S_N)$ is the statistical minimum of the N path slacks; and $f_{N,N}(S_1, \ldots, S_N) = \max(S_1, \ldots, S_N)$ is the statistical maximum of the N path slacks. The multilayer process coverage metric can then be redefined as:

$$C = P(f_{N,k}(S_1, \ldots, S_N) \leq S_M) \quad \text{(EQN. 13)}$$

As described in further detail below, the function $f_{N,k}(\cdot)$ can be computed recursively as:

$$f_{N,M}(S_1, S_N) = f_{M+1,M}(f_{N-1,1}(S_1, \ldots, S_{N-1}), \ldots f_{N-1,M}(S_1, \ldots, S_{N-1}), S_N) \quad \text{(EQN. 14)}$$

or as $$f_{N,M}(S_1, \ldots, S_N) = \min(f_{N-1,M}(S_1, \ldots, S_{N-1}), \max(f_{N-1,M-1}(S_1, \ldots, S_{N-1}), S_N)) \quad \text{(EQN. 15)}$$

Using EQN. 14 or EQN. 15, one can improve the evaluation of an M-layer coverage metric C from exponential complexity to linear complexity (e.g., O(NM) in time, and O(N+M) in space).

Referring back to EQN. 12, the following equivalent event is noted for M=2 and N=4 for path slacks $\{S_1, S_2, S_3, S_4\}$:
$\min\{\max\{S_1, S_2\}, \max\{S_1, S_3\}, \max\{S_1, S_4\}, \max\{S_2, S_3\}, \max\{S_2, S_4\}, \max\{S_3, S_4\}\} \leq S_M$
if and only if
the second smallest path slack of $\{S_1, S_2, S_3, S_4\} \leq S_M$.

Remembering the definition of $f_{N,k}(S_1, \ldots, S_N) \equiv k^{th}$ smallest path slack of N path slacks, one can derive EQN. 14 in more detail as follows:

$$f_{4,2}(S_1, S_2, S_3, S_4) = f_{3,2}(f_{3,1}(S_1, S_2, S_3), f_{3,2}(S_1, S_2, S_3), S_4)$$

$$f_{5,2}(S_1, S_2, S_3, S_4, S_5) = f_{3,2}(f_{4,1}(S_1, S_2, S_3, S_4), f_{4,2}(S_1, S_2, S_3, S_4), S_5)$$

$$f_{6,2}(S_1,S_2,S_3,S_4,S_5,S_6)=f_{3,2}(f_{5,1}(S_1,S_2,S_3,S_4,S_5),f_{5,2}(S_1,S_2,S_3,S_4,S_5),S_6)$$

...

$$f_{N,2}(S_1,\ldots,S_N)=f_{3,2}(f_{N-1,1}(S_1,\ldots,S_{N-1}),f_{N-1,2}(S_1,\ldots,S_{N-1}),S_N)$$

...

$$f_{N,M}(S_1,\ldots,S_N)=f_{M+1,M}(f_{N-1,1}(S_1,\ldots,S_{N-1}),\ldots,f_{N-1,M}(S_1,\ldots,S_{N-1}),S_N)$$

Thus, as the pattern implies, $f_{N,M}(S_1,\ldots,S_N)$ can be computed as shown in EQN. 14.

To derive $f_{N,M}(S_1,\ldots,S_N)$ as shown in EQN. 15, one can denote $R_{N,M}(\cdot)$ as the process space overlapped M times by N path slacks. Thus, $R_{N,M}(S_1,\ldots,S_N)=R_{N-1,M}(S_1,\ldots,S_{N-1}) \cup \{R_{N-1,M-1}(S_1,\ldots,S_{N-1}) \cap R_{1,1}(S_N)\}$. Thus, the process space covered M times by the path slacks $S_1$ through $S_N$ is the process space covered M times by path slacks $S_1$ through $S_{N-1}$, plus the joint space of the process space covered by path slack $S_N$ and the process space covered M−1 times by path slacks $S_1$ through $S_{N-1}$. Mathematically, this relation can be represented as shown in EQN. 15.

Figure 2:
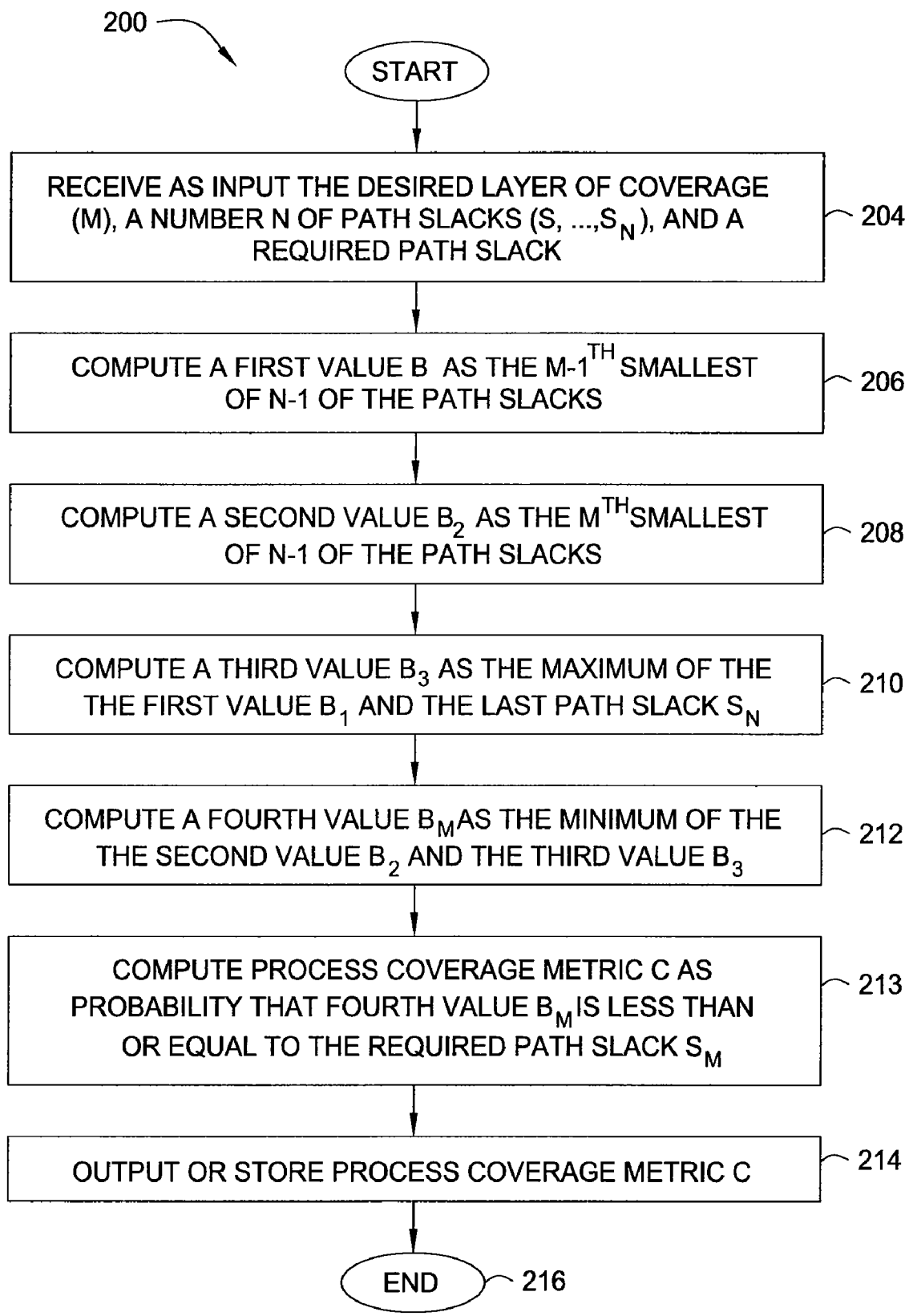
FIG. 2, for example, is a flow diagram illustrating one embodiment of a method for recursively computing a multilayer process coverage metric.

FIG. 2, for example, is a flow diagram illustrating one embodiment of a method 200 for recursively computing a multilayer process coverage metric C by referring to EQN. 15.

The method 200 is initialized at step 202 and proceeds to step 204, where the method 200 receives (e.g., from a user) as input the desired level of coverage (M), the number (N) of paths having path slacks ($\{S_1,\ldots,S_N\}$), and the required path slack $S_M$. As an example, supposed that M=2 and N=4 (i.e., $\{S_i\}=\{S_1, S_2, S_3, S_4\}$.

In step 206, the method 200 computes a first value $B_1$, where $B_1$ is the M−1$^{th}$ smallest path slack of N−1 of the path slacks. In other words, the first value $B_1=f_{N-1,M-1}(S_1,\ldots,S_{N-1})$. Thus, following the example above, $B_1=f_{3,1}(S_1, S_2, S_3)$.

In step 208, the method 200 computes a second value $B_2$, where $B_2$ is the M$^{th}$ smallest path slack of the N−1 path slacks. In other words, the second value $B_2=f_{N-1,M}(S_1,\ldots,S_{N-1})$. Thus, following the example above, $B_2=f_{3,2}(S_1, S_2, S_3)$.

In step 210, the method 200 computes a third value $B_3$, where $B_3$ is the maximum of the first value $B_1$ and the rest (last) path slack $S_N$. In other words, $B_3=\max(B_1, S_N)$. Thus, following the example above, $B_3=\max(f_{3,1}(S_1, S_2, S_3), S_N)$.

In step 212, the method 200 computes a fourth value $B_M$, where $B_M$ is the minimum of the second value $B_2$ and the third value $B_3$. In other words, $B_M=\min(B_2, B_3)$. Thus, following the example above, $B_M=\min((f_{3,1}(S_1, S_2, S_3)), (\max(f_{3,1}(S_1, S_2, S_3), S_N)))$.

In step 214, the method 200 computes the multilayer process coverage metric C as the probability that the fourth value $B_M$ is less than or equal to the required path slack $S_M$. In other words, $C=P(B_M \leq S_M)$. Thus, following the example above, $C=P(\min((f_{3,1}(S_1, S_2, S_3)), (\max(f_{3,1}(S_1, S_2, S_3), S_N))) \leq S_M)$.

In step 216, the method 200 outputs or stores the multilayer process coverage metric C (e.g., for use in at-speed testing or other applications) before terminating in step 218.

In other words, the method 200 computes the multilayer process coverage metric C for M-layer coverage as the probability that the M$^{th}$ smallest path slack in the process space is less than the required path slack $S_M$. Thus, the multilayer process coverage metric C can finally be given by:

$$C=P(f_{N,M}(S_1,\ldots,S_N) \leq S_M), \quad \text{(EQN. 16)}$$

thus confirming the logic of the method 200.

Each recursion as shown in the method 200 requires two min/max operations, as shown below (same as EQN. 15). For example:

$$f_{N,M}(S_1,\ldots,S_N)=\min(f_{N-1,M}(S_1,\ldots,S_{N-1}),\max(f_{N-1,M-1}(S_1,\ldots,S_{N-1}),S_N)) \quad \text{(EQN. 17)}$$

Figure 3:
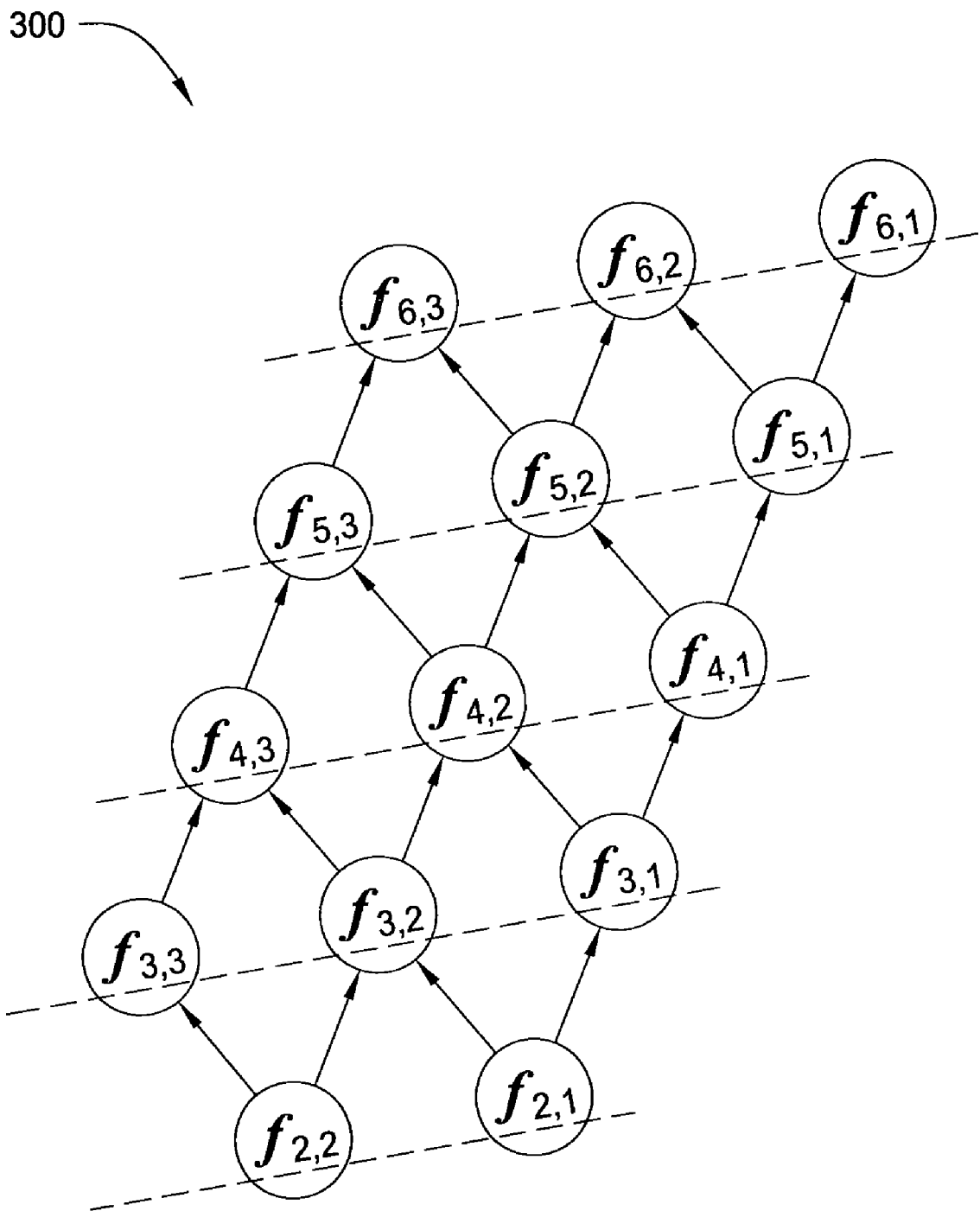
FIG. 3 illustrates an exemplary computation sequence graph for computing a multilayer process coverage metric.

The idea behind EQN. 17 can be understood with a simple example as shown in FIG. 3, which illustrates an exemplary computation sequence graph 300 for computing the multilayer process coverage metric C.

Consider the case of N=6 and M=3. To compute $f_{6,3}$ according to EQN. 17, one needs two inputs: $f_{5,3}$ and $f_{5,2}$, as well as two min/max operations: this holds similarly for the inputs $f_{5,3}$ and $f_{5,2}$. By organizing the data needed for each computation into a directed grid graph such as the graph 300, and sharing intermediate results among different computations, one obtains the pattern illustrated in FIG. 3.

Specifically, in FIG. 3, each node represents an input to a computation at a higher-level node, and each edge represents a single min or max operation. Thus, a given node's two input nodes and two edges (which correspond to the two inputs and the two min/max operations, respectively) are needed to compute the results stored at the given node according to EQN. 17. By performing the computation along the dashed lines bottom-up and only keeping those results necessary for the next level of computation, one can compute all required order statistics ($f_{6,3}$, $f_{6,2}$, and $f_{6,1}$) in linear time O(NM) and space O(N+M).

Thus, the total number of min/max operations for a given level of coverage N,M is equal to the number of edges. For instance, for N=6 and M=3 (represented as the point $f_{6,3}$ in FIG. 3), the number of min/max operations is (6−3)(3−1)+(3−1)(6−3)+(3−1)+(6−3+1−1)=(3)(2)+(2)(3)+2+3=17.

Thus, in general, the evaluation of the M-layer process coverage metric can be performed linearly.

In one embodiment, values of $f_{N,M}(S_1,\ldots,S_N)$ may be stored in a data structure such as a binary tree, allowing for quick computation and updating of the multilayer process coverage metric C. In this case, a second function $g_{N,k}(S_1,\ldots,S_N)$ is defined as:

$$g_{N,k}(S_1,\ldots,S_N) \equiv \{f_{N,1}(S_1,\ldots,S_N), f_{N,2}(S_1,\ldots,S_N),\ldots,f_{N,k}(S_1,\ldots,S_N)\} \quad \text{(EQN. 18)}$$

In other words, $g_{N,k}(S_1,\ldots,S_N)$ gives a set of k order statistics for N path slacks $S_1,\ldots,S_N$. Furthermore, $g_{N,k}(\cdot)=\{f_{N,1}(\cdot), f_{N,2}(\cdot),\ldots,f_{N,N}(\cdot)\}$ if N<k, i.e.:

$$g_{N,k}(S_1,\ldots,S_N) = \begin{cases} f_{N,1}(\cdot),\ldots,f_{N,k}(\cdot) & \text{if } N \geq k \\ f_{N,1}(\cdot),\ldots,f_{N,N}(\cdot) & \text{if } N < k \end{cases} \quad \text{(EQN. 19)}$$

Figure 4:
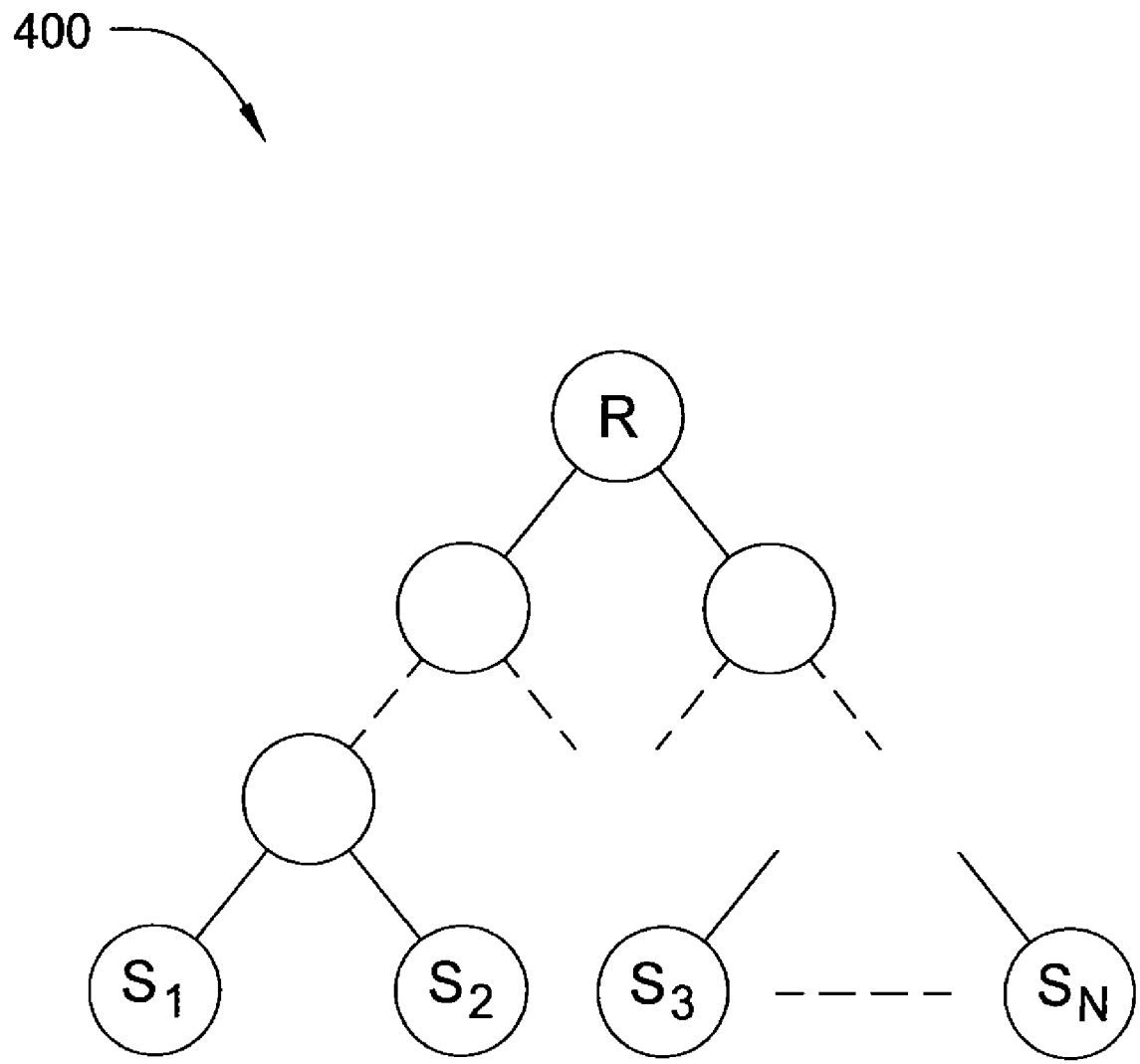
FIG. 4 illustrates one embodiment of a binary tree data structure for use in updating a multilayer process coverage metric.

FIG. 4 illustrates one embodiment of a binary tree data structure 400 for use in updating a multilayer process coverage metric. The binary tree comprises a plurality of interconnected nodes D, where each leaf node (e.g., nodes $S_1, S_2,\ldots, S_N$) corresponds to one path slack $S_i$. At every node D in the tree, two sets of slacks are stored: the node slack set $Q_D$ and the complement node slack set $\overline{Q}_D$. The former contains the first to M$^{th}$ order statistics of all downstream leaf node slacks; the latter contains the first to M$^{th}$ order statistics of all but the downstream leaf node slacks.

One can then compute the node slack set $Q_D$ and complement node slack $\overline{Q}_D$ set as follows:

$$Q_D = g_{2M,M}(Q_{Dleft} \cup Q_{Dright}) \quad \text{(EQN. 20)}$$

$$\overline{Q}_D = g_{2M,M}(Q_{Dlparent} \cup Q_{Dsibling}) \quad \text{(EQN. 21)}$$

where $D_{left}$, $D_{right}$, $D_{parent}$, and $D_{sibling}$ are node D's left child, right child, parent, and sibling nodes, respectively.

To populate the two sets of data for each node in the tree, two traversals of the tree are required. The first traversal is bottom-up from the leaves to the root by computing all node slack sets $Q_D$ via EQN. 20; the second traversal is top-down from the root to the leaves by computing all complement node slack sets $\overline{Q}_D$ via EQN. 21. As the input $g_{2M,M}(\cdot)$ is limited to 2M number of slacks, the complexity of constructing the binary tree data structure 400 is $O(NM^2)$.

It further follows that at the leaf node (for example, node that corresponds to slack $S_N$), one has:

$$Q_{S_N}=S_N \quad \text{(EQN. 22)}$$

$$\overline{Q}_{S_N}=g_{N-1,M}(S_1,\ldots,S_{N-1}) \quad \text{(EQN. 23)}$$

Thus, the multilayer process coverage metric can be computed at each leaf node as:

$$C=P(f_{M+1,M}(g_{N-1,M}(S_1,\ldots,S_{N-1}),S_N)\leq S_M) \quad \text{(EQN. 24)}$$

This is easy to update if the path slack at a leaf node (for example, $S_N$) is replaced.

For instance, the process coverage metric can be updated at the node $S_N$ by computing the leaf node path slacks as $Q_{S_N}=S_N$ and the complement leaf node path slacks as $\overline{Q}_{S_N}=g_{N-1,M}(S_1,\ldots,S_{N-1})$.

To determine if a newly computed process coverage metric is better than a previously computed process coverage metric, one can compute:

$$C=P(f_{M+1,M}(g_{(S_N),M},\tilde{S}_N)\leq S_M) \quad \text{(EQN. 25)}$$

by replacing the previous $S_N$ with the newly chosen $\tilde{S}_N$. If the newly computed process coverage metric is better, the replacement can be performed in $O(N^2M)$ time by updating the data structure 400 illustrated in FIG. 4 as follows. To perform bottom-up updating, one thread of a path from this leaf node to the root is used. To perform top-down updating, all internal nodes $O(N)$ are used. The total complexity is $O(NM^2)$.

To summarize, by utilizing the binary tree type of data structure and maintaining proper node slack sets and complement node slack sets, the complexity of updating the multilayer process coverage metric C can be reduced from $O(N^2M)$ to $O(NM^2)$. Typically, the number of required paths N is on the order of thousands, while the number of required layers M for coverage is less than ten. Therefore, the complexity is reduced from quadratic $O(N^2)$ to linear $O(N)$.

The multilayer process coverage metric may be used in place of a single-layer process coverage metric in substantially any circumstances where a single-layer process coverage metric is used. For example, the branch and bound type framework for path selection described in U.S. patent application Ser. No. 12/244,512, which is herein incorporated by reference in its entirety, may be adapted to benefit from the multilayer process coverage metric of the present invention. Moreover, the selected paths may be efficiently maintained and updated using a binary tree data structure or other data structure.

Although the process coverage metric of the present invention is described within the context of design automation, the process coverage metric may have application in other fields as well. Moreover, although the process coverage metric is described within the context of path selection for at-speed testing, the process coverage metric may have application in other aspects of design automation where path selection plays a role (e.g., variation-aware critical path reporting, common path pessimism removal, chip binning, yield optimization). Moreover, it is noted that one or more of N, M, and $S_M$ may be user defined.

Figure 5:
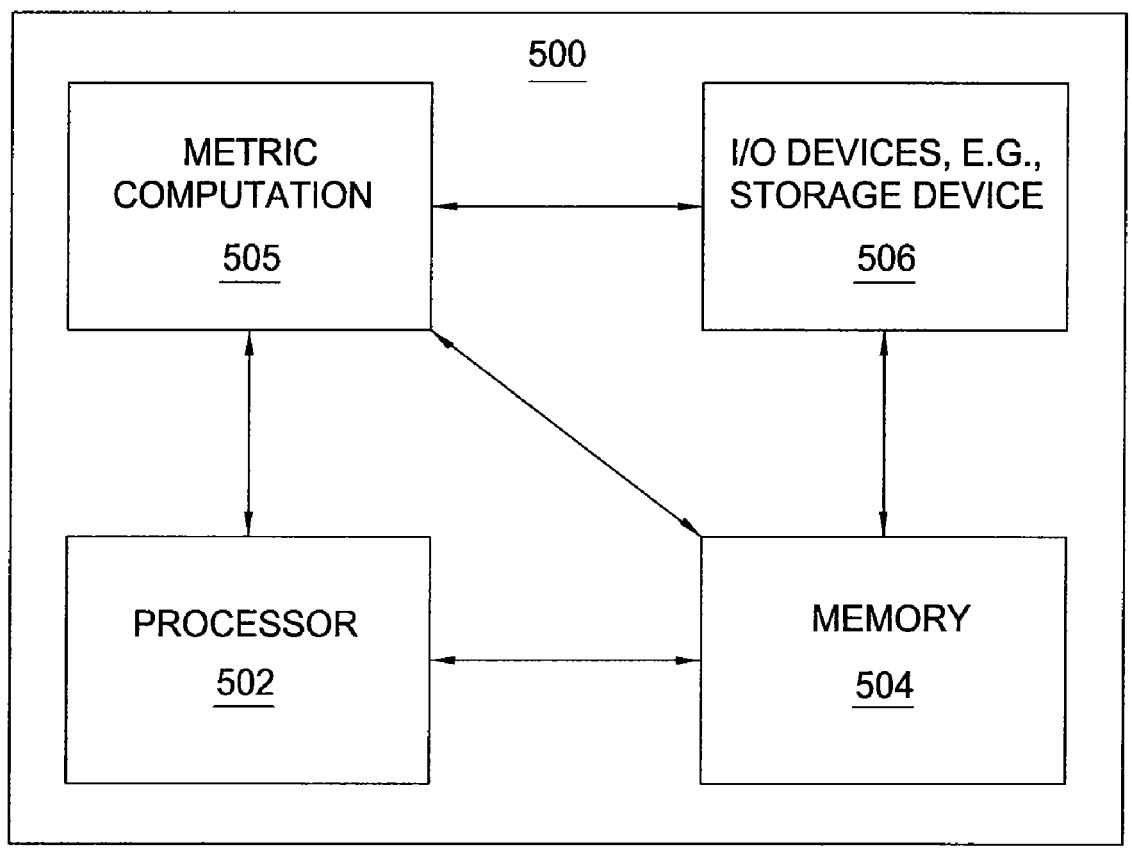
FIG. 5 is a high-level block diagram of the metric computation method that is implemented using a general purpose computing device.

FIG. 5 is a high-level block diagram of the metric computation method that is implemented using a general purpose computing device 500. In one embodiment, a general purpose computing device 500 comprises a processor 502, a memory 504, a metric computation module 505 and various input/output (I/O) devices 506 such as a display, a keyboard, a mouse, a stylus, a wireless network access card, and the like. In one embodiment, at least one I/O device is a storage device (e.g., a disk drive, an optical disk drive, a floppy disk drive). It should be understood that the metric computation module 505 can be implemented as a physical device or subsystem that is coupled to a processor through a communication channel.

Alternatively, the metric computation module 505 can be represented by one or more software applications (or even a combination of software and hardware, e.g., using Application Specific Integrated Circuits (ASIC)), where the software is loaded from a storage medium (e.g., I/O devices 506) and operated by the processor 502 in the memory 504 of the general purpose computing device 500. Thus, in one embodiment, the metric computation module 505 for computing a multilayer process coverage metric, as described herein with reference to the preceding Figures, can be stored on a computer readable storage medium or carrier (e.g., RAM, magnetic or optical drive or diskette, and the like).

It should be noted that although not explicitly specified, one or more steps of the methods described herein may include a storing, displaying and/or outputting step as required for a particular application. In other words, any data, records, fields, and/or intermediate results discussed in the methods can be stored, displayed, and/or outputted to another device as required for a particular application. Furthermore, steps or blocks in the accompanying Figures that recite a determining operation or involve a decision, do not necessarily require that both branches of the determining operation be practiced. In other words, one of the branches of the determining operation can be deemed as an optional step.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. A method for selecting a set of paths with which to test a process space, the method comprising:
   determining a number N of paths to be included in the set of paths, where each of the N paths has an associated path slack;
   determining a least number M of paths in N for which testing of the process space will fail;
   computing a metric that ensures that the set of paths satisfies the requirements of N and M; and
   outputting the metric for use in selecting the set of paths.

2. The method of claim 1, wherein N, M, and a required path slack $S_M$ for the set of paths are user defined.

3. The method of claim 1, wherein the computing comprises:
   calculating a first value as an $M-1^{th}$ smallest path slack among N−1 of the N paths;

calculating a second value as an $M^{th}$ smallest path slack among the N−1 of the N paths;

calculating a third value as a maximum of the first value and a last path slack among the N paths;

calculating a fourth value as a minimum of the first value and the third value; and computing the metric as a probability that the fourth value is less than or equal to a required path slack $S_M$ for the set of paths.

4. The method of claim 1, wherein the metric is substantially equal to a probability that the set of paths will fail testing.

5. The method of claim 1, wherein M is greater than one.

6. The method of claim 1, further comprising:
recursively updating the metric; and
outputting the metric, as updated.

7. The method of claim 6, wherein the metric is recursively updated in accordance with a binary tree data structure.

8. The method of claim 6, wherein the recursively updating includes two min/max operations.

9. The method of claim 1, wherein the set of paths is used to test a batch of integrated circuit chips at-speed.

10. A method for defining multilayer coverage of a process space for a given set of N path slacks, the method comprising:
receiving a least number M of paths in N for which testing of the process space will fail;
defining the multilayer coverage as a probability that a set of paths associated with the set of N path slacks will fail testing; and
outputting the metric.

11. The method of claim 10, wherein N, M, and a required path slack $S_M$ for the set of paths are user defined.

12. The method of claim 10, further comprising:
applying the metric for use in selecting a set of paths with which to test the process space.

13. The method of claim 10, wherein the computing comprises:
calculating a first value as an $M-1^{th}$ smallest path slack among N−1 of the set of paths;
calculating a second value as an $M^{th}$ smallest path slack among the N−1 of the set of paths;
calculating a third value as a maximum of the first value and a last path slack among the set of paths;
calculating a fourth value as a minimum of the first value and the third value; and
computing the probability that the set of paths associated with the set of N path slacks will fail testing as a probability that the fourth value is less than or equal to a required path slack $S_M$ for the set of paths.

14. The method of claim 10, wherein M is greater than one.

15. The method of claim 10, further comprising:
recursively updating the metric; and
outputting the metric, as updated.

16. The method of claim 15, wherein the metric is recursively updated in accordance with a binary tree data structure.

17. The method of claim 15, wherein the recursively updating includes two min/max operations.

18. The method of claim 10, wherein the metric is used to select a set of paths for testing a batch of integrated circuit chips at-speed.

19. A method for computing a metric to define a process space covered M times by a set of N path slacks $\{S_1, \ldots, S_N\}$, the method comprising:
computing a first value as a first portion process space covered M times by a subset of the set of N path slacks $\{S_1, \ldots, S_{N-1}\}$;
computing a second value as a joint space of a second portion process space covered by a last path slack $S_N$ of the set of N path slacks and a third portion of the process space covered M−1 times by the subset of the set of N path slacks $\{S_1, \ldots, S_N\}$;
summing the first value and the second value to produce the metric; and
outputting the metric.

20. The method of claim 19, wherein M is a least number of paths in N for which testing of the process space will fail.

21. The method of claim 19, further comprising:
recursively updating the metric; and
outputting the metric, as updated.

22. The method of claim 19, wherein N, M, and a required path slack $S_M$ for the set of paths are user defined.

23. A method for computing a metric to define a process space covered M times by a set of N path slacks $\{S_1, \ldots, S_N\}$, the method comprising:
recursively computing a function $f_{N,k}(\cdot)$ as a $k^{th}$ smallest path slack in the set of N path slacks;
computing the metric as a probability that the function $f_{N,k}(\cdot)$ is less than or equal to a minimum allowable path slack; and
outputting the metric.

24. The method of claim 23, wherein M is a least number of paths in N for which testing of the process space will fail.

25. The method of claim 23, wherein N, M, and a required path slack $S_M$ for the set of paths are user defined.

* * * * *